(12) United States Patent
Fitz et al.

(10) Patent No.: US 7,599,594 B1
(45) Date of Patent: Oct. 6, 2009

(54) METHOD OF FABRICATING WAVEGUIDE USING SACRIFICIAL SPACER LAYER

(75) Inventors: John L. Fitz, Baltimore, MD (US);
Daniel S. Hinkel, Sykesville, MD (US);
Scott C. Horst, Sykesville, MD (US)

(73) Assignee: The United States of America as represented by Director, National Security Agency, Washington, DC (US)

( * ) Notice: Subject to any disclaimer, the term of this patent is extended or adjusted under 35 U.S.C. 154(b) by 605 days.

(21) Appl. No.: 11/452,568

(22) Filed: Jun. 7, 2006

(51) Int. Cl.
*G02B 6/10* (2006.01)
*H01L 21/00* (2006.01)
*C03B 37/023* (2006.01)

(52) U.S. Cl. .................. 385/129; 385/130; 385/131; 438/29; 438/30; 438/31; 65/385; 65/386

(58) Field of Classification Search ............ 438/29–31; 385/3–4, 15–16, 22, 129–132; 372/43–45; 65/385–386
See application file for complete search history.

(56) References Cited

U.S. PATENT DOCUMENTS

| | | | | |
|---|---|---|---|---|
| 6,144,779 | A * | 11/2000 | Binkley et al. | 385/8 |
| 6,411,754 | B1 * | 6/2002 | Akkaraju et al. | 385/22 |
| 6,486,025 | B1 | 11/2002 | Liu et al. | |
| 6,577,785 | B1 * | 6/2003 | Spahn et al. | 385/22 |
| 6,807,353 | B1 * | 10/2004 | Fleming et al. | 385/132 |
| 6,813,293 | B2 * | 11/2004 | Johnson et al. | 372/46.015 |
| 6,921,491 | B2 * | 7/2005 | Ohtomo et al. | 216/24 |
| 7,208,334 | B2 * | 4/2007 | Asakawa et al. | 438/29 |
| 7,471,440 | B2 * | 12/2008 | Pan | 359/290 |
| 2002/0122648 | A1 * | 9/2002 | Mule' et al. | 385/129 |
| 2003/0031221 | A1 * | 2/2003 | Wang et al. | 372/45 |
| 2004/0214361 | A1 * | 10/2004 | Murakowski et al. | 438/31 |

OTHER PUBLICATIONS

U.S. Appl. No. 09/412,682, filed Nov. 1, 2001, Smith et al.
Wan Thai Hsu et al., "A Sub-Micron Capacitive Gap Process for Multiple-Metal-Electrode Lateral Micromechanical Resonators", Technical Digest, 14th International IEEE Micro Electro Mechanical Conference, Jan. 2001.
S. Rennon et al., "12 µm long edge-emitting quantum-dot laser", Electronics Letters, May 2001.

* cited by examiner

*Primary Examiner*—Brian M. Healy
*Assistant Examiner*—Guy G Anderson
(74) *Attorney, Agent, or Firm*—Jennifer Ferragut; Robert D. Morelli

(57) ABSTRACT

The present invention is a method of fabricating a waveguide using a sacrificial spacer layer. The first step in this process is to fabricate the underlying optical semiconductor structure. A trench is then etched in this structure and a sacrificial spacer layer is deposited in the trench. The waveguide is then created in the trench on the sacrificial spacer layer. User-defined portions of the sacrificial spacer layer are subsequently removed to create air gaps between the waveguide and the sidewalls of the trench in the optical semiconductor.

17 Claims, 2 Drawing Sheets

METHOD OF FABRICATING WAVEGUIDE USING SACRIFICIAL SPACER LAYER

FIELD OF THE INVENTION

The present invention relates to a semiconductor manufacturing process and, more specifically to a semiconductor manufacturing process for making a device including integrally formed optical waveguides.

BACKGROUND OF THE PRESENT INVENTION

Integration of semiconductor lasers to planar optical components, such as waveguides, semiconductor optical amplifiers (SOAs) and detectors, is important for photonic integrated circuit (PIC) applications. When working with PICs it is essential to control reflections from the interfaces between integrated photonic components. With proper design, interface reflections may be used to enhance performance of integrated lasers.

One method is to precisely space gaps between components to coherently enhance or reduce reflections from the interfaces. Prior art methods describe the use of resonant and anti-resonant etched gaps used to couple between lasers, SOAs and other lasers, taking advantage of the index discontinuity across air gaps to selectively enhance or reduce reflections across interfaces. A similar process has been demonstrated to create semiconductor lasers that make use of etched gaps in the semiconductor material to enhance reflectivity of the laser mirrors. At near-infrared wavelengths, electron beam lithography is frequently required to provide the necessary resolution to define the etch masks used to create the resonant gaps.

"A Sub-Micron Capacitive Gap Process for Multiple-Metal-Electrode Lateral Micromechanical Resonators," Wan Thai Hsu, et al, Technical Digest, 14th International IEEE Micro Electro Mechanical Conference, January 2001, discloses a process for fabricating a semiconductor having gaps between metal electrodes and a polysilicon resonator resident on the semiconductor. With this method, a sacrificial spacer layer is deposited on a substrate. A polysilicon mechanical resonator is then deposited and etched over the sacrificial layer, during which time portions of the sacrificial layer are removed, and the metal electrodes are formed through electroplating on either side of the resonator. The sacrificial layer is ultimately removed in its entirety. The present invention does not operate in the same manner as this process. The Hsu article is hereby incorporated by reference into the present invention.

"12 µm long edge-emitting quantum-dot laser," S. Rennon, et al, Electronics Letters, May 2001, discloses a series of mirrors and a central waveguide. Each of the mirrors and the central waveguide are etched. First order Bragg mirrors are patterned by electron-beam lithography on the rear side of the waveguide with air gaps etched between the Bragg gratings. Third order mirrors are etched on the front side of the waveguide. The first order air gaps between Bragg mirrors decrease diffraction loss in the laser (compared to third order air gaps) produced by this method. The present invention is not fabricated in the same manner as the invention of Rennon, et al. Rennon, et al is hereby incorporated by reference into the specification of the present invention.

"Air Trench Bends and Splitters for Dense Optical Integration in Low Index Contrast," Shoji Akiyama, et al, Journal of Lightwave Technology, July 2005, discloses air trench waveguides, and specifically air trench bend structures. It specifically describes a process for creating a waveguide with air trenches by first patterning the waveguide through a dry etching process and thereafter patterning the air trenches through a photolithography and dry etching process. The process of the present invention does not operate in this manner. Akiyama, et al is hereby incorporated by reference into the specification of the present invention.

U.S. patent application Ser. No. 09/412,682, entitled "SACRIFICAL SPACER FOR INTEGRATED CIRCUIT TRANSISTORS," discloses a semiconductor integrated circuit with a sacrificial sidewall. Specifically, temporary sidewalls are formed along the side of a gate electrode of a semiconductor. Source/drain regions are then formed on the semiconductor alongside the gate electrode, and the temporary sidewalls are removed, resulting in a space between the gate electrode and the source/drain regions. The present invention does not operate in this manner. U.S. patent application Ser. No. 09/412,682 is hereby incorporated by reference into the specification of the present invention.

U.S. patent application Ser. No. 6,486,025, entitled "METHODS FOR FORMING MEMORY CELL STRUCTURES," discloses two methods for forming memory cell structures in a semiconductor integrated circuit. One method includes the use of a sacrificial spacer layer formed adjacent to the sidewall of a capacitor of a field effect transistor formed on the semiconductor device. A dielectric layer is then formed alongside the spacer layer, through which a bitline stud layer is formed that is electrically connected to the source/drain regions of the field effect transistor. The sacrificial spacer layer is finally removed from the structure. The present invention operates in a different manner from this process. U.S. Pat. No. 6,486,025 is hereby incorporated by reference into the specification of the present invention.

The methods described above effectively create air gaps in semiconductor structures, however the processes are extremely inefficient as applied to optical devices. Typically several masking and etching steps are required to create both the components, such as waveguides, and the air gaps in optical devices. This can be both time-consuming and costly. What is desirable in the art is to create an efficient, inexpensive method of creating optical semiconductor devices with integrated air gaps.

SUMMARY OF THE INVENTION

It is an object of the present invention to provide a method of fabricating a waveguide using a sacrificial spacer layer.

It is a further object of the present invention to provide a method of fabricating a waveguide using a sacrificial spacer layer, wherein a single sacrificial spacer layer operates to create an air gap and to adhere the waveguide to the semiconductor device.

It is another object of the present invention to provide a method of fabricating a waveguide using a sacrificial spacer layer, wherein a single sacrificial spacer layer operates to create an air gap and to adhere the waveguide to the semiconductor device and wherein a wet etch is used to remove the sacrificial spacer layer.

The present invention is a method of fabricating a waveguide using a sacrificial spacer layer. The first step of the method is selecting a base structure.

The second step of the method is depositing an undercladding layer on the base structure.

The third step of the method is depositing a first cladding layer on the undercladding layer.

The fourth step of the method is depositing a core layer on the first cladding layer.

The fifth step of the method is depositing a second cladding layer on the core layer.

The sixth step of the method is depositing a cap layer on the second cladding layer.

The seventh step of the method is depositing an upper contact on the cap layer. At this point the base optical semiconductor structure is completed.

The eighth step of the method is etching a trench in the resultant structure, wherein the trench penetrates the upper contact, cap layer, second cladding layer, core layer, first cladding layer, and a user-definable portion of the undercladding and wherein the trench is of a user-definable width.

The ninth step of the method is depositing a sacrificial spacer layer along the trench.

The tenth step of the method is fabricating a waveguide on the sacrificial spacer layer.

The eleventh step of the method is removing a user-definable portion of the sacrificial spacer layer.

DETAILED DESCRIPTION OF THE PREFERRED EMBODIMENT

Figure 1:
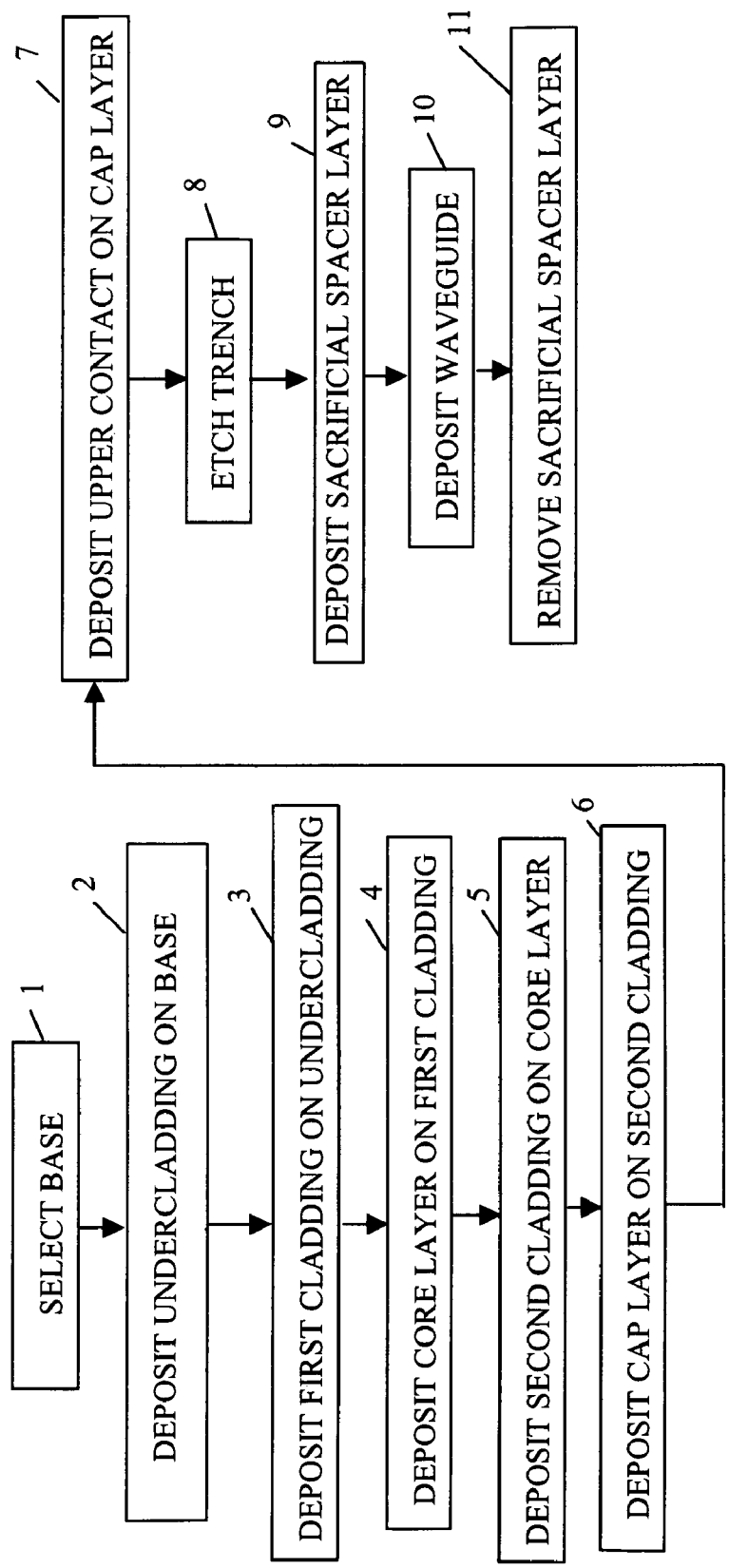
FIG. 1 is a flow chart of the steps of the present invention.

The present invention is a method of fabricating a waveguide using a sacrificial spacer layer. FIG. 1 shows the steps of an exemplary embodiment of the method of the present invention. The present invention can operate using any coherent photonic emitter structure, however it will be described with respect to a specific epitaxial structure. It will be understood by those of skill in the art that the method may operate with any suitable coherent photonic emitter structure, such as a standard bipolar, p-i-n semiconductor laser.

The first step 1 of the method is selecting a base structure. The base structure, for example a substrate, is composed of a compound semiconductor material and forms the base of the optical device fabricated according to the method of the present invention. In the preferred embodiment, the base structure is an n-type substrate, however the base structure may also be a p-type or undoped substrate according to user preferences. Many such base structures are commercially available, or can be readily produced. The base structure may be of any size, but preferably is approximately 3 inches in diameter.

The second step 2 of the present invention is depositing an undercladding layer on the base structure. This undercladding improves the electrical efficiency of the semiconductor laser structure. The undercladding layer can be deposited by any conventional method, such as epitaxial growth, chemical vapor deposition, or high-pressure thermal oxidation. The under-cladding layer is composed of a conventional compound semiconductor material. In the preferred embodiment the under-cladding layer is composed of a III-V semiconductor material, such as GaAs.

The third step 3 of the method is depositing a first cladding layer on the undercladding layer. As is well known to those in the art, a cladding layer is used in optical semiconductors to increase optical confinement in the active regions of the optical device. The first cladding layer is a compound semiconductor material, many of which are commercially available or easily producible. In the preferred embodiment the first cladding layer is composed of AlGaAs. The first cladding layer may be deposited through any conventional means, such as epitaxial growth, chemical vapor deposition, or physical vapor deposition.

The fourth step 4 of the present invention is depositing at least one core layer on the first cladding layer. The core layer operates as the active layer for the semiconductor laser. This core layer is composed of an appropriate compound semiconductor material that will be determined based on the material of the first cladding layer and the required optical properties of the completed optical device. If more than one core layer is required, a barrier layer with an electrical bandgap that is larger than the bandgap of the core layers is used to separate the core layers. In the preferred embodiment two core layers composed of InGaAs are separated by a barrier layer composed of AlGaAs. The core layer may be deposited on the first cladding layer by any conventional means, such as epitaxial growth, chemical vapor deposition, or physical vapor deposition.

The fifth step 5 of the method is depositing a second cladding layer on the core layer. As was explained with reference to the third step of the method, a cladding layer increases optical confinement in the active regions of the optical device. The second cladding layer is preferably composed of the same compound semiconductor material as the first cladding layer, although the second cladding material may be composed of any suitable compound semiconductor material many of which are commercially available or easily producible. In the preferred embodiment the second cladding layer is composed of AlGaAs. The second cladding layer may be deposited through any conventional means, such as epitaxial growth, chemical vapor deposition, or physical vapor deposition, however in the preferred embodiment the second cladding layer s deposited on the core layer in the same manner that the first cladding layer is deposited on the undercladding.

The sixth step 6 of the method is depositing a cap layer on the second cladding layer. The cap layer is integral to providing for electrical contact to the semiconductor laser. The cap layer is composed of a suitable compound semiconductor material compatible with the material of the second cladding layer. In the preferred embodiment the cap layer is composed of GaAs. The cap layer can be deposited by any conventional means, such as epitaxial growth, chemical vapor deposition, or high-pressure thermal oxidation.

The seventh step 7 of the method is depositing an upper electrical contact on the cap layer. The upper contact is typically composed of an Ohmic metal and is composed of a material or materials that provide the correct electronic work function required to establish a low resistance contact to the semiconductor material of the cap layer. In the preferred embodiment the upper contact is a p-type Ohmic metal for p-doped GaAs semiconductor material. In a further preferred embodiment the upper contact is composed of TiPtAu. The upper contact can be deposited by any conventional means, such as electron beam evaporation, thermal evaporation or sputtering.

As is obvious to those of skill in the art, each of the deposition steps above may include additional processing steps, such as polishing, etching, or grinding, to further refine the surfaces of each layer. Every such step is anticipated by this invention and may be used as desired by those skilled in the art. It is further anticipated that any necessary surface preparations for addition of a subsequent layer may be performed, as desired, before a subsequent layer is applied. Additionally, processing may be performed on the cap layer to planarize or otherwise process the surface before further proceeding with the method according to user preferences. Additionally, processing may be performed to create semiconductor lasers of specific geometries required for photonic device applications.

The eighth step 8 of the method is etching a trench in the resultant structure, wherein the trench penetrates the upper contact, cap layer, second cladding layer, core layer, first cladding layer, and a user-definable portion of the undercladding and the trench is of a user-definable width. A trench is a substantially U-shaped region created in an optical semiconductor for a number of purposes. First, the trench is necessary for proper performance of the laser, as the trench must first be created prior to creation of some components of the laser. Second, in some optical semiconductors the trench can be used to house additional components, such as waveguides. As is obvious to those of skill in the art, etching of the trench may also result in etching of the facets across the core layer, resulting in the creation of mirrors on each side of the resulting trench. The trench can be etched in the structure by any conventional method, but in the preferred embodiment a chlorine based plasma etch is used. In a further preferred embodiment the structure is etched using $BCl_3/Cl_2$. In the preferred embodiment, etching is performed to at least the first cladding layer. The goal is to etch through the core layer(s) to a depth that provides maximum transmission of the optical signal generated by the semiconductor optic device. In a further preferred embodiment, the undercladding is etched to a depth of no greater than 0.5 um past the first cladding layer. Depth into undercladding is therefore arbitrary, but a good practice would probably be to etch no more than 0.5 um past the lowest AlGaAs layer. The width of the trench is user definable, but in the preferred embodiment is approximately 8 um.

The ninth step 9 of the method is depositing a sacrificial spacer layer (S2L) along the horizontal and vertical trench surfaces and a user-definable portion of the remaining upper contact. The sacrificial spacer layer is preferably composed of an oxide material. In a further embodiment the sacrificial spacer layer is composed of $SiO_2$. The sacrificial spacer layer is of a user definable thickness, but in a preferred embodiment is approximately 236.25 nm on the vertical surfaces. The sacrificial spacer layer can be deposited on the structure by any conventional means, but is preferably deposited using a conformal process.

The tenth step 10 of the method is fabricating a waveguide on the sacrificial spacer layer. In the preferred embodiment, the waveguide material fills the remaining portion of the trench, however the waveguide may fill less than the entire trench according to user preferences. Any suitable material can be used for the waveguide, however in the preferred embodiment a polymer material is used, such as benzocyclobutene (BCB.) Any suitable method can be used to deposit the waveguide on the sacrificial spacer layer, such as spin coating the waveguide material on the sacrificial spacer layer. Excess waveguide material may exist after deposition of the waveguide, such as material that has been deposited on the upper contact or that rises above the level of the trench. In a preferred embodiment, if any excess material exists after deposition of the waveguide, it is removed through a plasma etch process such as reactive ion etching (RIE.) This RIE may be performed using appropriate plasmas, such as a fluorine based plasma. The removal of the excess guide material exposes the S2L material near the regions where gaps are required. This then allows a wet chemical access to the S2L material so that the S2L can be selectively removed.

The eleventh step 11 of the method is removing the sacrificial spacer layer from the upper contact and a user-definable portion of the trench. In the eleventh step 11 a user-definable portion of the sacrificial spacer layer is removed to create gaps between the waveguide and the portions of the undercladding, first cladding layer, core layer, second cladding layer, cap layer, and upper contact that were exposed on each side of the trench. The sacrificial spacer layer may additionally be removed from a user-definable portion of the base of the trench, however a sufficient amount of the sacrificial spacer layer must remain to adhere the waveguide to the base of the trench. The sacrificial spacer layer can be removed by any conventional means, however in the preferred embodiment it is removed by a timed wet etch. The timed etched is preferably performed with buffered hydrofluoric acid.

The result of the above described process is an optical semiconductor device consisting of a laser with an integral waveguide with side air gaps. The air gaps exist between the waveguide and the sidewalls of the trench formed by the etching process of the eighth step 8 of the method. The air gaps also exist between the laser facets and the waveguide input surface. This process is less time consuming and more cost efficient than previous methods for creating air gaps in optical semiconductor devices as a single step is required for the creation of the sacrificial spacer layer and the adhesion layer for the waveguide. Removal of the sacrificial spacer layer also occurs in a single step. Additionally, a single step is used for creation of gaps which reduce losses in the waveguide while also creating the gap that provides for controlled coupling of a semiconductor laser into the waveguide. Because simple processes are used to achieve each step, the method of the present invention creates significant advantages over the prior art inventions.

Figure 2:
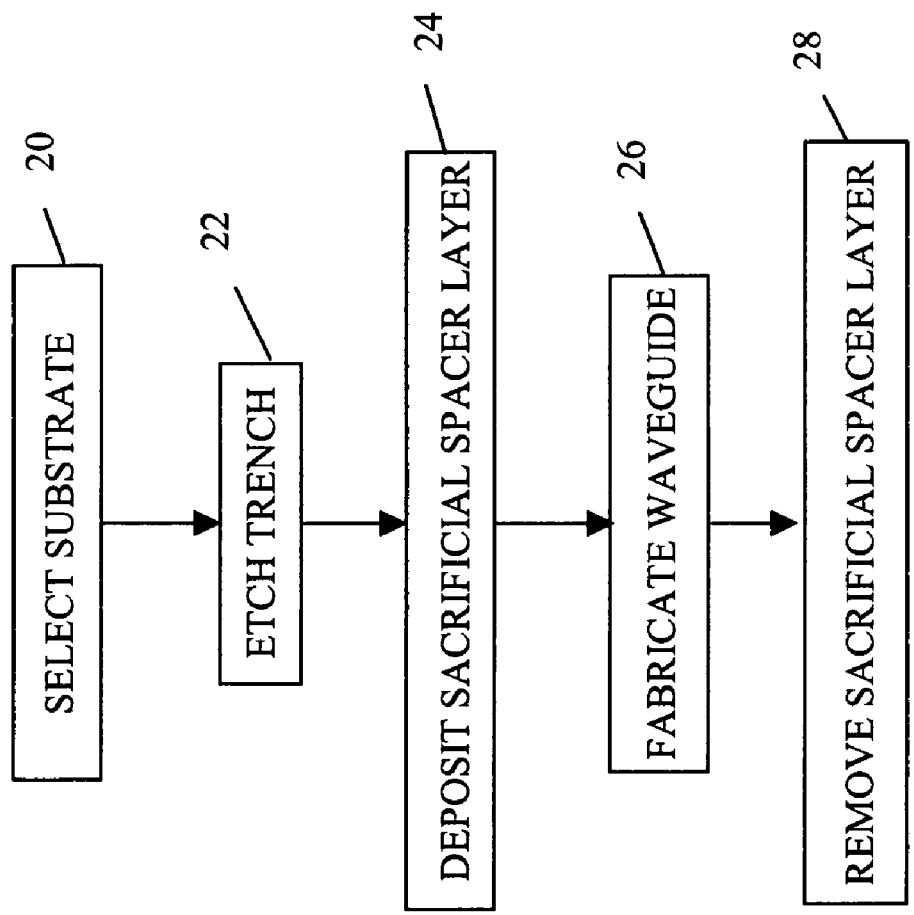
FIG. 2 is a flow chart of the steps of a second alternative embodiment of the present invention.

An alternative embodiment of the invention is shown in FIG. 2. The first step 20 of the alternative embodiment is selecting a substrate. The substrate can be composed of any suitable material, such as silica, quartz, or glass, many of which are well known and commonly used in the art. Such substrates are commercially available or can be produced through known methods. In a preferred embodiment the substrate is approximately 0.020 in thickness.

The second step 22 of the alternative embodiment is etching a trench in the substrate, wherein the trench penetrates the substrate and the trench is of a user-definable width. A trench is a substantially U-shaped region created in a substrate just as it was in an optical semiconductor, as explained in greater detail above with reference to eighth step 8 of the method shown in FIG. 1. The trench of the second step 22 of the third embodiment exemplified in FIG. 2 is essentially identical to that discussed above. To achieve a substantially U-shaped trench the trench must not be etched entirely through the substrate. This etching can be performed by any conventional method, such as a chlorine-based plasma etch, however the process will depend on the substrate material. In the preferred embodiment the trench depth is 3 microns.

The third step 24 of the alternative embodiment is depositing a sacrificial spacer layer within the trench. The substrate must be resistant to at least one etch material capable of etching the sacrificial spacer layer. The sacrificial spacer layer is essentially identical to the sacrificial spacer layer of the ninth step 9 of the embodiment exemplified in FIG. 1 and therefore will not be described in greater detail.

The fourth step 26 of the alternative embodiment exemplified in FIG. 2 is fabricating a waveguide on the sacrificial spacer layer. The fourth step 26 is essentially identical to the tenth step 10 of the first embodiment of FIG. 1, and therefore will not be described in greater detail.

The fifth step 28 of the method of the alternative embodiment exemplified in FIG. 2 is removing the sacrificial spacer layer from a user-definable portion of the trench. In the fifth step 28 a user-definable portion of the sacrificial spacer layer is removed to create gaps between the waveguide and the substrate. This step is essentially identical to the eleventh step 11 of the first embodiment of FIG. 1. In the alternative embodiment the dimensions of the gap must be large enough to prevent evanescent coupling between the waveguide and the substrate. As is obvious to those of skill in the art, this does not require precise gap dimensions.

In an alternative step of the alternative embodiment of FIG. 2 an etch resistant coating is applied to the substrate prior to application of the sacrificial spacer layer. This coating is resistant to the etchant which is used to remove the sacrificial spacer layer. As is obvious to those of skill in the art, the substrate and waveguide must be resistant to the etch used to remove the sacrificial spacer layer to prevent damage to those elements during removal of the sacrificial spacer layer. If an etch resistant coating is used, the substrate material need not be resistant to the etch used to remove the sacrificial spacer layer. For example, if the sacrificial spacer layer is removed using buffered hydrofluoric acid the substrate may be coated with a material that is resistant to this etchant. The substrate may therefore be susceptible to removal by buffered hydrofluoric acid, but will be protected by the etch resistant coating during removal of the sacrificial spacer layer. This increases the options for the substrate material.

What is claimed is:

1. A method for creating an optical semiconductor device comprising the steps of:
   a) selecting a base structure;
   b) depositing a first cladding layer on the base structure;
   c) depositing a core layer on the first cladding layer;
   d) depositing a second cladding layer on the core layer;
   e) depositing a cap layer on the second cladding layer;
   f) depositing an upper contact on the cap layer;
   g) forming a trench in through a user-definable portion of the upper contact, cap layer, second cladding layer, the core layer, the first cladding layer, to at least a user-definable depth in the first cladding layer, wherein the trench is of a user-definable width, and where the trench has two walls and a floor;
   h) depositing a sacrificial spacer layer on the two walls and floor of the trench;
   i) fabricating a waveguide on the sacrificial spacer layer; and
   j) removing a user-definable portion of the sacrificial spacer layer, where a user-definable portion of the sacrificial spacer layer remains on the floor of the trench to anchor the waveguide.

2. The method of claim 1, wherein the step of fabricating a waveguide on the sacrificial spacer layer further includes the steps of:
   a) depositing a waveguide material on a user-definable portion of the sacrificial spacer layer; and
   b) etching any excess waveguide material to form the waveguide.

3. The method of claim 2, wherein the step of depositing a sacrificial spacer layer on the two walls and floor of the trench comprises depositing a sacrificial spacer layer on the two walls and floor of the trench and a user-definable portion of the upper contact that is not within the trench.

4. The method of claim 3, wherein the step removing a user-definable portion of the sacrificial spacer layer comprises removing a user-definable portion of the sacrificial spacer layer, wherein the user definable portion comprises the entire sacrificial spacer layer on the upper contact that is not within the trench and a user-definable portion of the remainder of the sacrificial spacer layer.

5. The method of claim 4, wherein the step of depositing an upper contact on the cap layer comprises depositing an upper contact on the cap layer, wherein the upper contact is complementary to the base structure such that a p-n junction is formed between the two.

6. The method of claim 5, wherein the step of depositing a sacrificial spacer layer on the two walls and floor of the trench comprises depositing a sacrificial spacer layer on the two walls and floor of the trench and a user-definable portion of the upper contact that is not within the trench and further wherein the sacrificial spacer layer is deposited by a conformal process.

7. The method of claim 6, wherein the step of removing a user-definable portion of the sacrificial spacer layer comprises removing a user-definable portion of the sacrificial spacer layer, wherein the user definable portion comprises the entire sacrificial spacer layer on the upper contact that is not within the trench and a user-definable portion of the remainder of the sacrificial spacer layer and further wherein the sacrificial spacer layer is removed using a timed etch process.

8. The method of claim 7, wherein the step of fabricating a waveguide material on a user-definable portion of the sacrificial spacer layer comprises depositing a waveguide material on a user-definable portion of the sacrificial spacer layer, wherein the waveguide material is benzocyclobutene.

9. The method of claim 8, wherein the step of depositing a waveguide material on a user-definable portion of the sacrificial spacer layer comprises depositing a waveguide material on a user-definable portion of the sacrificial spacer layer, wherein the waveguide material is benzocyclobutene and further wherein the material is deposited on the sacrificial spacer layer by spin coating.

10. The method of claim 9, wherein the step of depositing a sacrificial spacer layer on the two walls and floor of the trench comprises depositing a sacrificial spacer layer on the two walls and floor of the trench and a user-definable portion of the upper contact that is not within the trench and further wherein the sacrificial spacer layer is deposited by a conformal process and is composed of an oxide material.

11. The method of claim 2, wherein the step of depositing a sacrificial spacer layer on the two walls and floor of the trench comprises depositing a sacrificial spacer layer on the two walls and floor of the trench and a user-definable portion of the upper contact that is not within the trench.

12. The method of claim 11, wherein the step removing a user-definable portion of the sacrificial spacer layer comprises removing a user-definable portion of the sacrificial spacer layer, wherein the user definable portion comprises the entire sacrificial space layer on the upper contact that is not within the trench and a user-definable portion of the remainder of the sacrificial spacer layer.

13. The method of claim 2, wherein the step of deposing a sacrificial space layer on the two walls and floor of the trench comprises depositing a sacrificial spacer layer on the two walls and floor of the trench and a user-definable portion of the upper contact that is not within the trench and further wherein the sacrificial spacer layer is deposited by a conformal process.

14. The method of claim 11, wherein the step of removing a user-definable portion of the sacrificial spacer layer comprises removing a user-definable portion of the sacrificial spacer layer, wherein the user definable portion comprises the entire sacrificial spacer layer on the upper contact that is not within the trench and a user-definable portion of the remainder of the sacrificial spacer layer and further wherein the sacrificial spacer layer is removed using a timed etch process.

15. The method of claim 2, wherein the step of depositing a waveguide material on a user-definable portion of the sacrificial spacer layer comprises depositing a waveguide material on a user-definable portion of the sacrificial spacer layer, wherein the waveguide material is benzocyclobutene.

16. The method of claim 2, wherein the step of depositing a waveguide material on a user-definable portion of the sacrificial spacer layer comprises depositing a waveguide material on a user-definable portion of the sacrificial spacer layer, wherein the waveguide material is benzocyclobutene and further wherein the material is deposited on the sacrificial spacer layer by spin coating.

17. The method of claim 11, wherein the step of depositing a sacrificial spacer layer on the two walls and floor of the trench comprises depositing a sacrificial spacer layer on the two walls and floor of the trench and a user-definable portion of the upper contact that is not within the trench and further wherein the sacrificial spacer layer is deposited by a conformal process and is composed of an oxide material.

* * * * *